United States Patent
Masui

(10) Patent No.: US 8,406,264 B2
(45) Date of Patent: Mar. 26, 2013

(54) NITRIDE SEMICONDUCTOR LASER ELEMENT

(75) Inventor: Shingo Masui, Anan (JP)

(73) Assignee: Nichia Corporation, Anan-shi (JP)

( * ) Notice: Subject to any disclaimer, the term of this patent is extended or adjusted under 35 U.S.C. 154(b) by 287 days.

(21) Appl. No.: 12/902,974

(22) Filed: Oct. 12, 2010

(65) Prior Publication Data

US 2011/0026554 A1 Feb. 3, 2011

Related U.S. Application Data

(62) Division of application No. 12/174,258, filed on Jul. 16, 2008, now Pat. No. 7,838,316.

(30) Foreign Application Priority Data

Jul. 18, 2007 (JP) .................................. 2007-186432
Jul. 14, 2008 (JP) .................................. 2008-182302

(51) Int. Cl.
*H01S 5/125* (2006.01)
*H01S 5/183* (2006.01)
(52) U.S. Cl. ........................... 372/43.01; 372/92; 372/96
(58) Field of Classification Search ............... 372/43.01, 372/29.022

See application file for complete search history.

(56) References Cited

U.S. PATENT DOCUMENTS

| 6,482,666 B1 | 11/2002 | Kobayashi et al. |
| 6,751,242 B2 * | 6/2004 | Kaneko et al. ............. 372/43.01 |
| 6,884,648 B2 | 4/2005 | Hasegawa et al. |
| 7,358,156 B2 | 4/2008 | Tanaka et al. |
| 7,995,632 B2 * | 8/2011 | Yamashita et al. ......... 372/43.01 |
| 2005/0030994 A1 | 2/2005 | Kozaki et al. |

FOREIGN PATENT DOCUMENTS

| JP | 2003-332244 A | 11/2003 |
| JP | 2004-158500 A | 6/2004 |
| JP | 2004-327879 A | 11/2004 |
| JP | 2005-159278 A | 6/2005 |
| JP | 2005-175056 A | 6/2005 |

* cited by examiner

*Primary Examiner* — Mary Wilczewski
(74) *Attorney, Agent, or Firm* — Global IP Counselors, LLP

(57) ABSTRACT

A nitride semiconductor laser element includes a laminate. The laminate includes on a substrate a first conductivity type nitride semiconductor layer, an active layer, and a second conductivity type nitride semiconductor layer, and constitutes a cavity resonator. The laminate includes an element region, an exposed region and an island layer. The element region is a region in which the laser element is formed. The exposed region is a region in which at least the first conductivity type nitride semiconductor layer is exposed on both sides of the element region in the cavity direction, and which is provided continuously in a cavity resonating direction of the laser element. The island layer is separated from the element region by the exposed region, and that is disposed in a corner of the nitride semiconductor laser element.

6 Claims, 11 Drawing Sheets

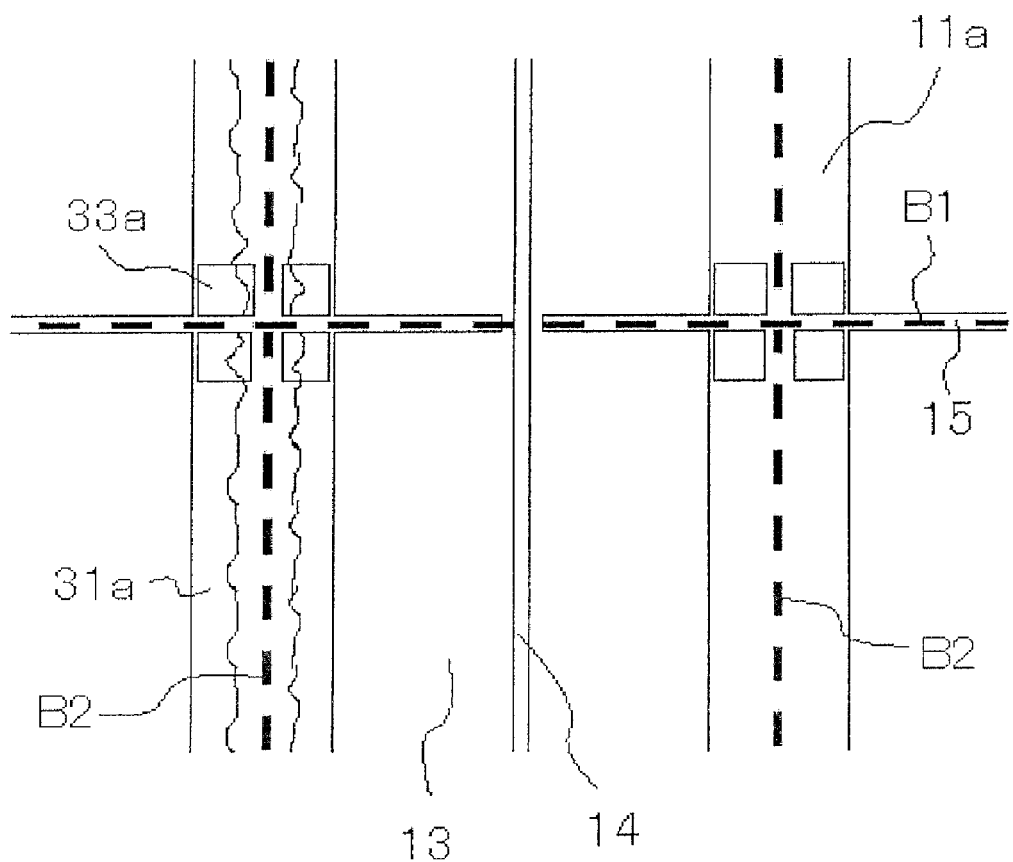

NITRIDE SEMICONDUCTOR LASER ELEMENT

CROSS-REFERENCE TO RELATED APPLICATIONS

This application is a divisional application of U.S. patent application Ser. No. 12/174,258 filed on Jul. 16, 2008, now U.S. Pat. No. 7,838,316 Also, this application claims priority to Japanese Patent Application No. 2007-186432, filed on Jul. 18, 2007, and Japanese Patent Application No. 2008-182302, filed on Jul. 14, 2008. The entire disclosures of U.S. patent application Ser. No. 12/174,258 and Japanese Patent Application Nos. 2007-186432 and 2008-182302 are hereby incorporated herein by reference.

BACKGROUND OF THE INVENTION

1. Field of the Invention

This invention relates to a method for manufacturing a nitride semiconductor laser element and a nitride semiconductor laser element.

2. Background Information

There is growing demand for semiconductor laser elements in which a compound semiconductor, for example, nitride semiconductors expressed by the general formula $In_xAl_yGa_{1-x-y}N$ ($0 \leq x$, $0 \leq y$, $0 \leq x+y \leq 1$) are used, in a wide variety of applications, such as in optical disk systems capable of recording and reproducing large volumes of information at high density (such as a next-generation DVD), or in electronic devices such as personal computers. Therefore, considerable research has been devoted to using nitride semiconductors to manufacture semiconductor laser elements with good reproducibility while maintaining stable characteristics.

For example, a method in which grooves that extend in a cavity direction of a laser element and is formed from the upper face of a nitride semiconductor growth layer to the interface constituting a pn junction has been proposed as a method for preventing chipping, pulverization, etc., of a ridge that would otherwise be caused by propagation from a region of concentrated dislocation in the substrate if a cavity end face is formed by cleavage, and thereby reducing damage to the nitride semiconductor laser element and protecting the current-voltage characteristics (see, JP-2004-327879-A).

However, even when the cleavage of a cavity end face is performed substantially perpendicular to these grooves, the effect of the dislocation density, crystal defects, etc., within the nitride semiconductor layer or substrate can cause the cleavage plane to be distorted from its intended position, making it difficult to obtain a sufficiently stable yield.

Usually, when a nitride semiconductor laser element is produced, a semiconductor layer and electrodes are formed in a wafer state, after which the wafer is divided into bars (hereinafter also referred to as "primary cleavage"), and the semiconductor layer bars are divided into chips (hereinafter also referred to as "secondary cleavage"). Consequently, if the primary cleavage is distorted from its intended position, a laser element of the desired cavity length will not be obtained, and this greatly affects the characteristics. Also, when the division is made where the electrodes are formed, the electrodes may droop down to the cavity end face, and this adversely and markedly affects the characteristics. Furthermore, it is difficult to divide the semiconductor layer bars into chips, and this greatly affects the yield.

Also, usually, cleaving into bars forms the cavity end face of the nitride semiconductor laser element, and an end face protective film is formed on the cavity end face. That is, light is emitted from the cavity end face formed in primary cleavage. Accordingly, high accuracy is required in primary cleavage, or, to put it another way, a smooth cavity end face needs to be formed.

Dislocations and crystal defects are generally present in a nitride semiconductor. When a laser element is produced from a nitride semiconductor, a problem is that leakage caused by these dislocations and crystal defects can lower the voltage in the minute electric current region and result in poor current and voltage characteristics. If the start-up voltage is low, this leads to problems such as a shorter element service life and poor electrostatic discharge.

SUMMARY OF THE INVENTION

An object is to provide a nitride semiconductor laser element in which a decrease in start-up voltage can be prevented, good current and voltage characteristics as well as consistent quality can be obtained.

According to one aspect of the present invention, a nitride semiconductor laser element includes a laminate. The laminate includes on a substrate a first conductivity type nitride semiconductor layer, an active layer, and a second conductivity type nitride semiconductor layer, and constitutes a cavity resonator. The laminate includes an element region, an exposed region and an island layer. The element region is a region in which the laser element is formed. The exposed region is a region in which at least the first conductivity type nitride semiconductor layer is exposed on both sides of the element region in the cavity direction, and which is provided continuously in a cavity resonating direction of the laser element. The island layer is separated from the element region by the exposed region, and that is disposed in a corner of the nitride semiconductor laser element.

With the nitride semiconductor laser element of the present invention, a decrease in start-up voltage can be prevented, good current and voltage characteristics as well as consistent quality are obtained.

BRIEF DESCRIPTION OF THE DRAWINGS

FIG. 2(a) is a magnified view of FIG. 2(a), and FIGS. 2(b) and 2(c) are simplified cross sections illustrating the laser elements formed by the manufacturing method of the present invention;

FIG. 8 is simplified plan view illustrating still another layout of the element region and exposed region formed by the manufacturing method of the present invention;

DETAILED DESCRIPTION OF THE PREFERRED EMBODIMENTS

Figure 1:
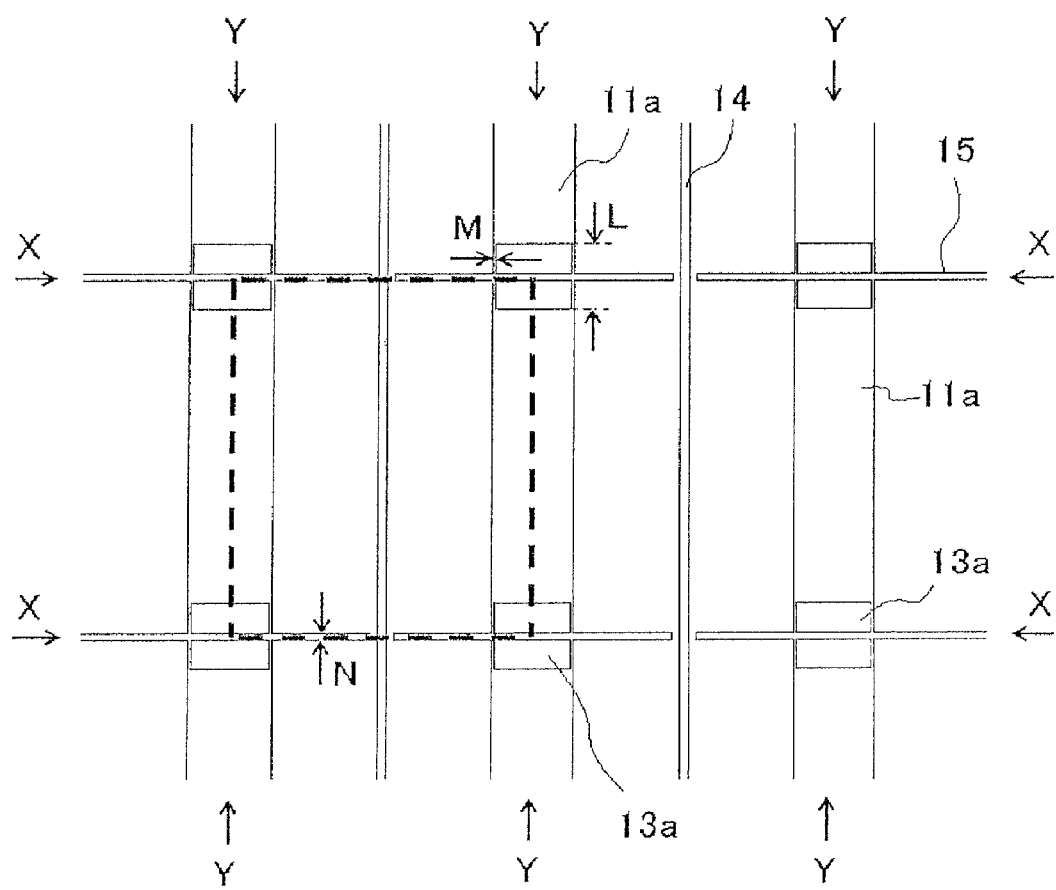
FIG. 1 is simplified plan view illustrating the layout of the element region and exposed region formed by the manufacturing method of the present invention.

For manufacturing a nitride semiconductor laser element of the present invention, firstly, a laminate of semiconductor layers in which a first conductivity type nitride semiconductor layer, an active layer and a second conductivity type nitride semiconductor layer are formed above a substrate in that order are provided.

The substrate here may be a insulating substrate, such as sapphire, spinel ($MgAl_2O_4$), and a substrate, such as SiC (6H, 4H, 3C), Si, ZnSe, ZnO, GaAs, diamond, oxide substrates which are lattice-matched to a nitride semiconductor, such as lithium niobate, neodymium gallate, but it is preferably a nitride semiconductor substrate, such as GaN, AlN, etc.

The substrate is, for example, preferably a nitride semiconductor substrate having an off angle of no more than 10° and greater than 0.03° to the first main face and/or the second main face. The thickness of the substrate is at least 50 μm and no more than 10 mm, for example.

The nitride semiconductor substrate can be formed by a vapor phase growth method such as MOCVD (Metal Organic Chemical Vapor Deposition), HVPE (Hydride Vapor Phase Epitaxy), MBE (Molecular Beam Epitaxy), or the like, a hydrothermal synthesis method in which crystals are grown in a supercritical fluid, a high pressure method, a flux method, a melt method, or the like. A commercially available substrate may be used.

The nitride semiconductor substrate may be a substrate in which dislocation density is periodically distributed in a stripe shape in-plane on at least one surface. An example is to form a semiconductor layer in which regions having a lower dislocation (for example, a first region) and a high dislocation (for example, a second region) are formed by ELO (Epitaxial Lateral Overgrowth) method in an alternating manner in a stripe shape, or to form a semiconductor layer by lateral growth on a substrate, and use this semiconductor layer as a substrate to dispose a stripe region of a different crystal defect density, crystal direction, etc. A polarity may be distributed in a stripe shape at the first region and the second region. The high dislocation region may be in circular shape, elliptic shape, square shape and the like as well as a stripe shape.

The low dislocation region may have a dislocation density per unit area of $1\times10^7/cm^2$ or less, and preferably $1\times10^6/cm^2$ or less, and the high dislocation region may have a higher dislocation density than the low dislocation region.

When the first and second regions extend alternatively in stripes, the first region may have a width of about 10 to 500 μm, preferably about 100 to 500 μm, and the second region may have a width of 2 to 100 μm, preferably 10 to 50 μm. The shape of the stripe may be a broken line.

When the second region is in circular shape, the second region may have a diameter of about 2 to 100 μm. When the second region is in elliptic shape, the second region may have a major axis diameter of about 2 to 100 μm and a minor axis diameter of about 2 to 100 μm.

Those dislocation measuring can be employed a CL (cathode luminescence) method or TEM (Transmission Electron Microscopy) observation.

Also, a different crystal growth face may be distributed on one surface of the nitride semiconductor substrate. For example, when the first region may be the plane (0001), the second region may be the plane (000-1), the plane (10-10), the plane (11-20), the plane (10-14), the plane (10-15), the plane (11-24) and other crystal growing plane, among these, the plane (000-1) is preferable. If such substrate having a partially different crystal growth face is employed, stress and distortion occurred in the substrate can be lessened. This allows laminating the semiconductor layers to be thicker, i.e., more than 5 μm thick without forming a stress relieving layer over the substrate.

Any of the various known substrates disclosed, for instance, in JP-2005-175056-A, JP-2004-158500-A, JP-2003-332244-A, or the like may be used.

The substrate is preferably a substrate over which a buffer layer, intermediate layer, for example, a layer having a general formula of $Al_xGa_{1-x}N$ ($0 \leq x \leq 1$), or the like may be formed before forming the laminate which functions as a laser element.

The laminate formed on the first surface of the substrate is composed of nitride semiconductor, and may include a layer having a general formula of $In_xAl_yGa_{1-x-y}N$ ($0 \leq x \leq 1$, $0 \leq y \leq 1$, $0 \leq x+y \leq 1$). In addition to this, it may be used the semiconductor layer which is partly substituted with B as a group III element, or is substituted a part of N as a group V element with P or As.

The first and second conductivity type nitride semiconductor layers mean n-type or p-type nitride semiconductor layers, respectively. The n-type nitride semiconductor layer may doped with at least one n-type impurity of IV or VI group elements, such as Si, Ge, Sn, S, O, Ti, Zr, Cd etc. The p-type nitride semiconductor layer may doped with at least one p-type impurity, such as Mg, Zn, Be, Mn, Ca, Sr etc. The doped concentration is, for example, about $5\times10^{16}/cm^3$ to about $1\times10^{21}/cm^3$. All of layers in the n-type or p-type nitride semiconductor layers may not necessarily contain n-type or p-type impurity.

The laminate preferably has a structure which is a SCH (Separate Confinement Hetero-structure) wherein an optical waveguide is constituted by providing n-side and p-side optical guide layers above and below the active layer. The first and second conductivity type nitride semiconductor layers may have structures in which composition and/or thickness of the layers are different to each other.

The laminate is produced, for example, by growing a first conductivity type nitride semiconductor layer (hereinafter also referred to as an "n-type semiconductor layer" or "n-side semiconductor layer"), an active layer, and a second conductivity type nitride semiconductor layer (hereinafter also referred to as a "p-type semiconductor layer" or "p-side semiconductor layer"), in that order. The n-type semiconductor layer and the p-type semiconductor layer may have a single film structure, a multilayer structure, or a super-lattice structure comprising two layers of mutually different compositional ratios. These layers may also have a composition gradient layer or a concentration gradient layer. By the formation of cavity in the laminate, the light generated in the active layer is resonated and amplified.

The n-type semiconductor layer may have a structure comprising two or more layers of different compositions and/or impurity concentrations.

For example, a first n-type semiconductor layer may be composed of $Al_xGa_{1-x}N$ ($0 \leq x \leq 0.5$), and preferably $Al_xGa_{1-x}N$ ($0 \leq x \leq 0.3$). The specific condition of film growing may preferably be at growing temperature of about 900° C. or more in the reactor. Also, the first n-type semiconductor layer can function as a clad layer. A suitable film thickness is about 0.5 to 5 μm.

A second n-type semiconductor layer can function as a light waveguide layer and is composed of $In_xAl_yGa_{1-x-y}N$ ($0<x \leq 1$, $0 \leq y<1$, $0<x+y \leq 1$). A suitable film thickness is about 0.1 to 5 μm. The second n-type semiconductor layer can be omitted.

One or more semiconductor layers may be additionally formed between the n-type semiconductor layers.

The active layer may have either a multiple quantum well structure or a single quantum well structure. The well layer is preferably expressed by the general formula $In_xAl_yGa_{1-x-y}N$ ($0<x \leq 1$, $0y<1$, $0<x+y \leq 1$) and contains at least indium. Light can be emitted in the UV band by raising the aluminum content. Light can be emitted in a wavelength band of 300 to 650 nm. Emission efficiency can be improved by forming the active layer with a quantum well structure.

The p-type semiconductor layer is laminated over the active layer.

A first p-type semiconductor layer can be formed from $Al_xGa_{1-x}N$ ($0 \leq x \leq 0.5$) containing p-type impurities. The first p-type semiconductor layer functions as a p-side electron confinement layer.

A second p-type semiconductor layer can be formed from $In_xAl_yGa_{1-x-y}N$ ($0<x \leq 1$, $0 \leq y<1$, $0<x+y \leq 1$).

A third p-type semiconductor layer can be formed from $Al_xGa_{1-x}N$ ($0 \leq x \leq 0.5$) containing p-type impurities. The third p-type semiconductor layer is preferably formed by a super lattice structure comprising GaN and AlGaN. The third p-type semiconductor layer functions as a p-side clad layer.

A fourth p-type semiconductor layer can be formed from $Al_xGa_{1-x}N$ ($0 \leq x \leq 1$).

Indium may be mixed in the crystals of these semiconductor layers. The first p-type semiconductor layer and the second p-type semiconductor layer can also be omitted. The suitable thickness of each layer is about 3 nm to 5 μm. One or more semiconductor layers may be additionally formed between the p-type semiconductor layers.

There is no particular restriction on a growth method of the nitride semiconductor layer, it can be formed by means of any known method which can grow these nitride semiconductor layers, such as MOVPE (Metal-Organic Vapor Phase Epitaxy), MOCVD, HVPE, MBE or the like. In particular, MOCVD is preferable because it allows the nitride semiconductor to be growth with good crystallinity under the condition of reduced pressure to atmospheric pressure.

Next, the exposed region is then formed.

Figure 2A:
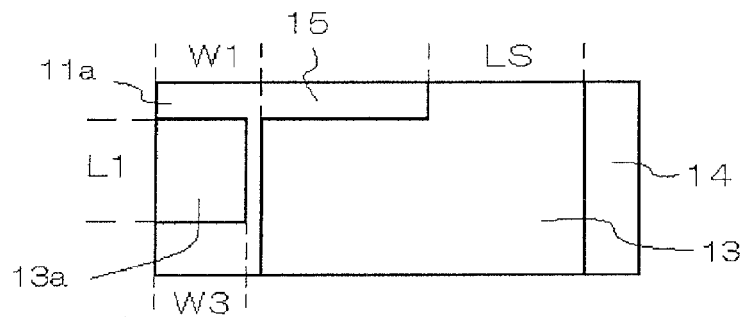
FIG. 2(a) is simplified plan view illustrating the unit element.
Figure 2A:
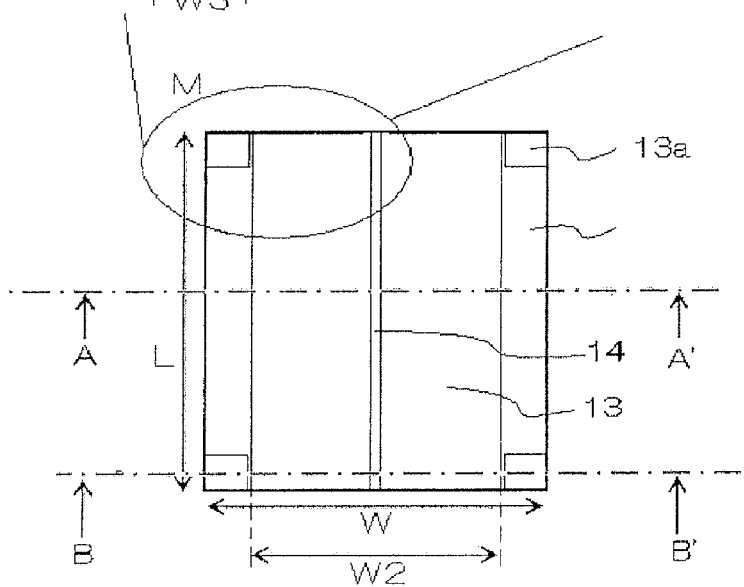

As shown in FIGS. 1 and 2a, for example, an exposed region 11a is formed on one or both sides of the region of the laminate surface in which the laser elements are formed (for example, the region demarcated by the arrows X and Y in FIG. 1, and enclosed by the broken line). In other words, it is formed continuously in the cavity direction (hereinafter also referred to as the "length direction"; the direction along the arrow Y) in the region on one or both sides and adjacent to the element region. As a result, the second conductivity type nitride semiconductor layer of the laminate, for example, is separated into an element region and an island layer.

Figure 2B:
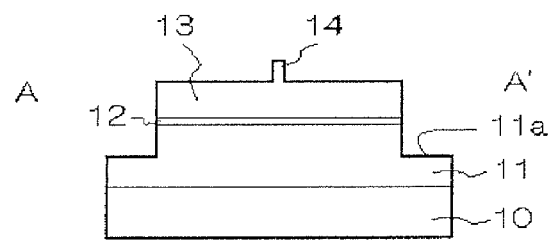

The element region is that region of the laminate that functions as a laser element. This refers to a region having the first conductivity type nitride semiconductor layer, the active layer, and the second conductivity type nitride semiconductor layer on the substrate, and having an optical waveguide within this laminate. For instance, as shown in FIG. 2b, this is the region of the second conductivity type nitride semiconductor layer 13 that includes a ridge 14 in top view.

The exposed region 11a is formed by removing at least the second conductivity type nitride semiconductor layer and the active layer. If desired, it can also be formed by optionally removing part of the substrate and/or the first conductivity type nitride semiconductor layer. The removal of these layers can be accomplished by forming the desired mask pattern, just as in the formation of the ridge, and using this mask to etch in the thickness direction of the laminate. The result is that the first conductivity type nitride semiconductor layer or the substrate is exposed in the exposed region 11a, and the exposed region 11a extends in the cavity direction.

There are no particular restrictions on the shape of the exposed region, but the planar shape of the laser element generally is that of a quadrangle, a parallelogram, a rectangle, a square, or a shape that resembles one of these, so the planar shape of the exposed region is preferably the same as the shape of the laser element (in this case, a shape that includes the island layer 13a near the cavity end (near the region along the arrows X in FIG. 1)). For example, if the element region has a planar shape that is substantially rectangular, it is good for the exposed region to be substantially rectangular as well.

The length of the exposed region (the length in the cavity direction) can be suitably determined according to the cavity length. There are no particular restrictions on the width W1 (the width of the shape including the island layer near the cavity end) of the exposed region in the direction perpendicular to the cavity direction (hereinafter also referred to as the "width direction"; the direction along the arrows X), but a specific example is a range from 1 to 300 μm, and preferably 2 to 200 μm, and more preferably 5 to 100 μm. The width W1 of the exposed region may vary in parts, with the region being wider or narrower.

Here, the cavity length L of the laser element (see FIG. 2a', which is a detail enlargement of the area near M in FIG. 2a) is preferably about 200 to 1200 μm, and the width W of the laser element about 100 to 500 μm. The width W2 of the element region is preferably about 30 to 400 μm.

If a plurality of element regions are formed on the substrate, such as when a plurality of the elements are formed as a matrix or in the direction perpendicular to the cavity direction, then a plurality of the exposed regions are also formed.

Figure 6:
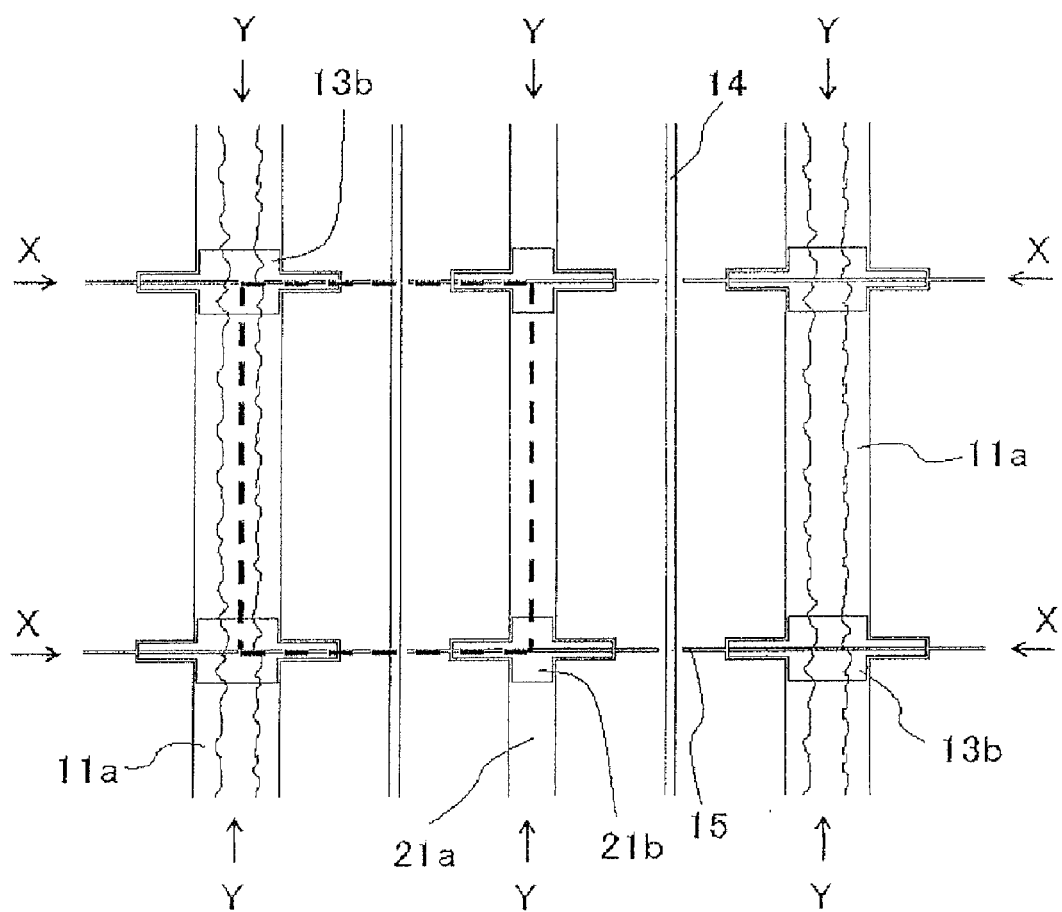
FIG. 6 is simplified plan view illustrating another layout of the element region and exposed region formed by the manufacturing method of the present invention.

As shown in FIG. 1, when a plurality of elements are formed adjacent to one another on a wafer, the exposed regions are formed between the adjacent elements, allowing elements to be obtained by dividing at the exposed regions during secondary cleavage. Also, when a plurality of exposed regions are formed, the widths of the exposed regions 11a may be all the same as shown in FIG. 1, or the widths of the exposed regions 11a and 21a may be different as shown in FIG. 6.

In a special nitride semiconductor substrate described above, the widths of the exposed regions are adjusted as appropriate, according to differences such as the disposition of the first region and/or second region and so force, the dislocation density, the crystal defect density, the impurity concentration, the degree of texturing, the crystal plane etc.

For example, it is preferable to use a layout in which the widths of the exposed regions are alternatively different from each other.

If the widths of the exposed regions are thus formed according to the disposition of the first region and/or second region, etc., for example, then the active layer and so forth constituting the cavity can be separated from regions with relatively high dislocation density, crystal defect density, etc., in the substrate and in the semiconductor layer laminated thereon, and it will be possible to prevent leak current caused by dislocations, crystal defects, and so forth in the active layer.

Also, the width of the element region may be varied and the width of the exposed region may be substantially fixed. In this case, it is particularly effective when a special nitride semiconductor substrate is used as in varying the width of the exposed region. That is, the widths of the element regions are adjusted as appropriate, according to differences such as the disposition of the first region and/or second region and so force, the dislocation density, the crystal defect density, the impurity concentration, the degree of texturing, the crystal plane etc. on the substrate. For example, it is preferable to use a layout in which the widths of the element regions are periodically different from each other.

If the widths of the element regions are thus formed according to the disposition of the first region and/or second region, etc., for example, then the active layer and so forth constituting the cavity can be separated from regions with relatively high dislocation density, crystal defect density, etc., in the substrate and in the semiconductor layer laminated thereon, and it will be possible to prevent leak current caused by dislocations, crystal defects, and so forth in the active layer.

The island layer can be formed by leaving the second conductivity type nitride semiconductor layer and the active layer separated into islands, in part of the exposed region, during the formation of the exposed regions. The phrase "separated into islands" here means that the active layer and the second conductivity type nitride semiconductor layer are separated from the element region, and that they are formed shorter than the cavity length in the cavity direction.

With the present invention, the island layer is formed so as to sandwich the intended division location (the arrow X direction in FIGS. 1 and 6), the result being that cleavage is guided so as to be carried out at the intended division locations, and the substrate and the laminate can be divided at the desired locations, forming a cavity end face. Even if the cleavage should deviate from the intended location, there will be no further deviation from the intended division location due to the exposed regions formed on the outside of the island layer, so the cleavage direction is straightened, and this improves the cleavage yield. Therefore, the island layer is preferably formed near the cavity end face, and formed so as to follow the intended division locations indicated by the arrows X.

As shown in FIG. 2a', the length L1 of the island layer is preferably about $1/100$ to $1/5$ with respect to the cavity length L. The width W3 of the island layer is preferably about $1/50$ to $1/2$ the width W of the laser element. More specifically, the length L1 of the island layer may be about 3 to 100 μm, preferably about 5 to 50 μm, and the width W3 of the island layer may be about 3 to 100 μm, preferably about 5 to 50 μm.

If the island layer is formed as a rectangle as shown in FIGS. 1 and 2, then it is good for the ratio of the width W3 to length L1 of the island layer to be about 10:1 to 1:10. One or more island layers are formed within a single exposed region formed on one side of an element. If more than one are formed, they may be disposed aligned in the cavity direction, or disposed aligned in the width direction of the elements, but one each is preferably formed near the cavity end face on both sides as shown in FIGS. 1 and 6.

The island layer is preferably not continuous in the cavity direction, and is instead separated.

The wafer will be distorted when the laminate is formed on the substrate, but distortion of the wafer can be lessened by removing the laminate from suitable regions. In particular, cracking can be suppressed and distortion effectively lessened by removing the laminate from near the center in the cavity direction. This allows handling of the wafer in the manufacturing process to be smoother, and makes it possible to manufacture laser elements of consistent quality more efficiently.

Usually, with a semiconductor laser element, in addition to the division step in which the cavity end face is formed (primary cleavage), there is also a step of dividing in the cavity direction (a secondary cleavage step of forming a side face of an element).

In this secondary cleavage step, the element may be damaged by breakage in an unintended direction, which is attributable to the crystal system of the substrate or laminate, etc. However, as shown in FIG. 8 if the island layer is separated, rather than being continuous in the cavity direction, then the exposed region that is formed there will serve as an auxiliary groove for secondary cleavage, so the yield in the secondary cleavage step can be increased. In particular, if the island layer is present only at the end near the cavity end face, then cleavage will be guided so as to be carried out at the desired location, so the cleavage direction is straightened, and this further improves the yield in the secondary cleavage step.

In particular, with a substrate and laminate composed of a material having a hexagonal crystal structure, problems such as chipping during cleavage tend to occur when a side face is formed on an element at a plane other than the M plane or C plane (such as the A plane or R plane).

However, a good yield can be achieved in secondary cleavage by forming the island layer as discussed above, forming a groove by laser scribing at the intended division location in the cavity direction, and then dividing in the cavity direction. In this case, the exposed region is preferably formed at substantially the same width as the width of the island layer. Also, the exposed region is preferably provided such that it is wider than the auxiliary groove (discussed below).

There are no particular restrictions on the shape or size of the island layer, which can be suitably adjusted according to the width of the exposed region and so forth. For example, it is good for the shape of the island layer to correspond to the shape of part of the exposed region. The island layer may be narrower than the width of the exposed region, as long as electrical insulation can still be ensured between the island layer and the laminate in the element region. That is, the island layer is preferably provided separated, so as to be insulated from the element regions in the active layer and the p-type semiconductor layer.

If it is, then when the specific nitride semiconductor substrate discussed above is used, a region then the active layer and so forth constituting the cavity can be separated from regions with relatively high dislocation density, crystal defect density, etc., and it will be possible to prevent leak current caused by dislocations, crystal defects, and so forth in the active layer. Furthermore, even if dirt should adhere, for example, to a chip side face during secondary cleavage or in a subsequent step, since the element region is insulated from the island layer as mentioned above, the generation of leak current or the breakage of crystals from portions thereof can be prevented.

An example of a width that will ensure insulation here is one in which the width M in FIG. 1 is about 0.1 to 10 μm and preferably about 1 to 5 μm. Also, the island layer may be disposed within about 5 μm or less, and especially about 4 μm or less, from the cavity end face cleaved by means of the auxiliary groove discussed below.

During cleavage, the cleavage could deviate slightly from the intended location due to abnormal growth, partial crystal defects, etc. On the other hands, according to the present invention, there will be no further deviation from the intended division location at the exposed region between the island layer and the element region, and repositioning the cleavage direction to intended division location from the exposed region can be achieved. This avoids a decrease in cleavage yield.

As shown in FIG. 1, when a plurality of elements are formed adjacent to each other in their width direction on a wafer, an island layer that is continuous between the adjacent elements can be formed. In this case, the island layer does not need to be symmetrical with the adjacent elements, and can be formed in any shape. This island layer may be separated by providing an exposed portion as discussed below. The island layer provided flanking this exposed portion need not be symmetrical, and can be formed in any shape.

The pattern of the exposed region and the island layer is preferably formed such that, as shown in FIG. 6, in the region constituting the cavity end face of the element region (near the faces divided by the arrows X), the width of the island layer and the exposed region is partially greater (hereinafter, a region formed such that the width of the island layer and the exposed region is partially greater will be referred to as a "wide region" or "protrusion"). That is, the exposed region and the island layer may have a protrusion in the width direction. With the present invention, since the island layer is provided at a corner of the element, the protrusion in the width direction may be formed protruding to the ridge side.

From another standpoint, the exposed region and the island layer may have a protrusion in the length direction. A protrusion in the length direction may be formed in the cavity direction.

When the island layer is provided so as to protrude, the exposed region is formed so as to encompass this island layer.

Figure 7A:
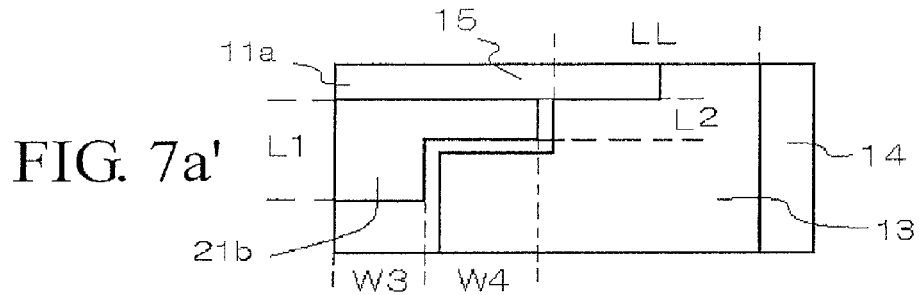
FIG. 7(a) is simplified plan view illustrating the unit element, FIG. 7(a') is a magnified view of FIG. 7(a), and FIGS. 7(b) to 7(d) are simplified cross sections illustrating the laser elements formed by the manufacturing method of the present invention.
Figure 7A:
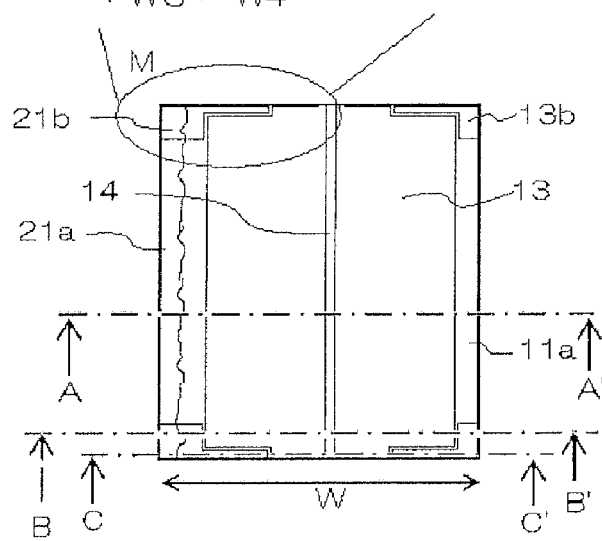
Figure 7B:
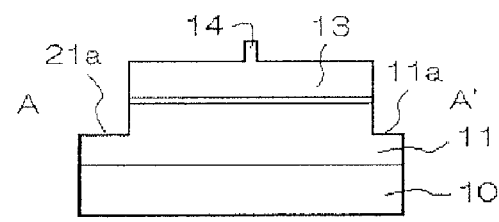
Figure 7C:
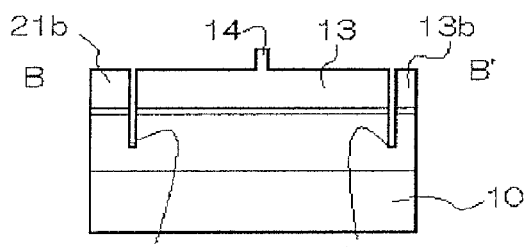
Figure 7D:
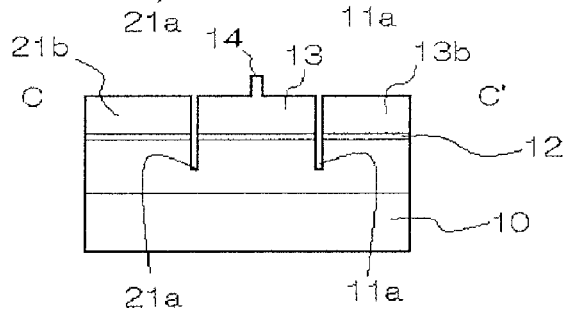

For example, as shown in FIG. 7a', which is a detail enlargement of the area near M in FIG. 7a, a protrusion with a length L2 and a width W4 is provided in the width direction of the island layer with a length L1 and a width W3. In other words, a protrusion with a length L1-L2 and a width W3 is provided in the cavity direction of the island layer with a length L2 and a width W3+W4 formed near the cavity end face. The exposed region is formed around the outer periphery of this protrusion, and is separated from the element region.

The width W4 of the protrusion is about ½ to 10 times the width W3 of the island layer (W3:W4=1:2 to 10:1). More specifically, it is preferably about 10 to 100 with about 20 to 55 μm being even better. The length L2 of the protrusion is about ⅒ to 2 times the length L1 of the island layer (L1: L2=10:1 to 1:2). More specifically, it is preferably about 2 to 100 μm, with about 3 to 50 μm being even better. An exposed region with a width of about 0.1 to 10 μm, and preferably 1 to 5 μm, is formed around the outer periphery of the island layer and the protrusion. The length LL from the end of the exposed region to the ridge is preferably about 0.1 to 100 μm, with about 2 to 40 μm being even better. From another standpoint, there is preferably separation of about ⅕ to 20 times the ridge width. Forming a protrusion in this way in particular affords a smooth cleavage plane in the light emission region.

The length L2 of the wide region (the length of the protrusion) is preferably about ⅕ or less, and more preferably about ⅒ or less, with respect to the cavity length L. A specific example of the range is about 2.0 to 100 μm, and preferably about 3 to 50 μm.

Also, the width of the wide region (W3+W4) is preferably about 1/20 to ⅘ with respect to the width W of the laser element. More specifically, the width W3 of the island layer is about 3 to 100 and preferably about 5 to 50 μm. Forming the wide region in this way makes it possible for the island layer to form a guide of the proper shape during cleavage of the cavity end face discussed below.

If the exposed region is formed so that its width (the width of the shape including the island layer near the cavity end) is greater in some part, then the island layer may be formed correspondingly wider in some part as shown in FIG. 6. That is, the island layer is mainly constituted by may be formed continuously from the wide region to a region of less width, in a corresponding shape (FIG. 6), or may be formed only in the wide region and in a shape corresponding to the shape thereof. Furthermore, it may be formed in a corresponding shape in only the narrower region (the region with the original width of the exposed region other than that near the end face). Forming the island layer wider makes it possible to cleave at the desired location by having the island layer serve as an effective guide in the cleavage of the cavity end face in a subsequent step.

When the island layer is formed partially wider, the extent by which the width is increased may be about the same as that in the exposed region. The length over which the width is increased may be about the same as that in the exposed region.

As shown in FIGS. 8 and 12, a plurality of island layers 33a may be disposed in a direction perpendicular to the cavity direction. In particular, the island layers are preferably formed so as to separate to each other at the intended division location in the cavity direction. That is, an exposed region is provided so that the intended division location within the island layer (the region indicated by the broken lines B1 and B2 in the auxiliary groove 15) is vertical split in the cavity direction. As a result, the exposed region provided so as to vertical split the island layer guides the cleavage to the desired location, so not only is the yield of primary cleavage increased, but there is less chipping during cleavage, and the yield can also be increased in the secondary cleavage step.

Figure 11A:
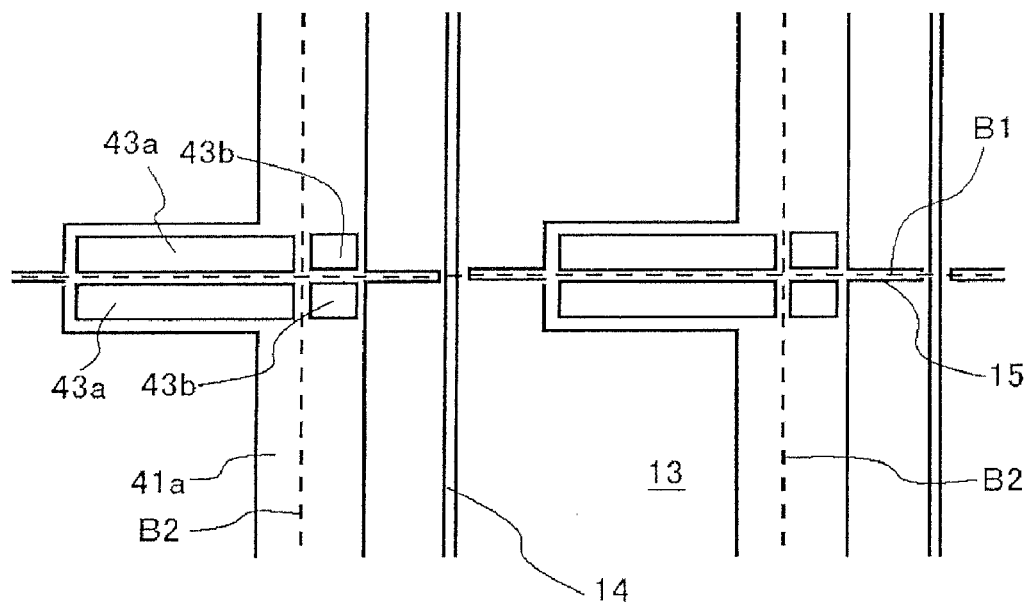
FIG. 11(a) is simplified plan view illustrating another layout of the element region and exposed region formed by the manufacturing method of the present invention, and 11(b) is simplified plan view illustrating the unit element.
Figure 11B:
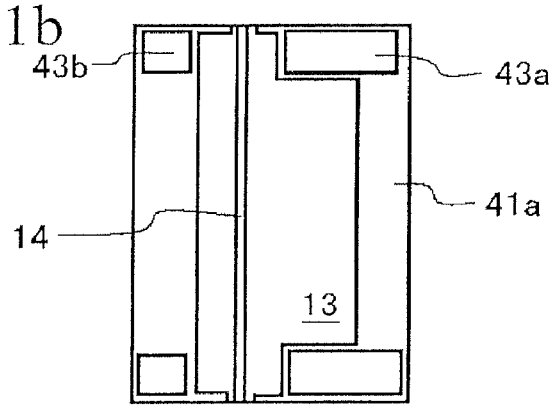

As shown in FIGS. 11a and 11b, an exposed region 41a may have a wide region on just one side of the element, and an island layer 43a may be provided corresponding to this wide region. In other words, the wider island layer 43a may be formed on just one side of the element, and an exposed region may be provided so as to encompass this part. Providing a wide region on just one side allows the ridge to be shifted away from the center of the laser element.

During wire bonding to the laser element, if the bonding is performed over the ridge, the impact thereof may damage the ridge, for example.

However, the wire bonding can be performed away from the ridge by providing a wide region as mentioned above. Therefore, when the nitride semiconductor layer is made narrower in order to achieve a more compact size, the region in which wire bonding is performed can be made larger.

The island layer may be disposed at the end face on at least the light emission side of the cavity, but is preferably disposed on the opposite side as well.

Also, the island layer is preferably disposed in symmetry with respect to the ridge at the end face on at least the light emission side of the cavity. This allows optical confinement to be accomplished favorably, and contributes to transverse mode stability of the emitted light. Therefore, the island layer may be disposed at just one location out of the two cavity end face sides and the two sides in the cavity direction, but is preferably disposed at all of these. This will afford better cleavage on the two side faces of the laser element.

The auxiliary groove is then formed. The auxiliary groove (hereinafter, it will be also referred to as a "first auxiliary groove") is provided extending in a direction perpendicular to the cavity direction. In a wafer state, the auxiliary groove is formed within the island layer or adjacent to the island layer. A cavity end face is formed by dividing the substrate and the laminate along the auxiliary groove. Therefore, in an element state, it is provided adjacent to the island layer. The auxiliary groove may be formed at least one cavity end face.

Within the island layer provided inside the exposed region, the auxiliary groove may be disposed so as to horizontally split the island layer as shown in FIG. 1 and elsewhere, or may be disposed apart from the exposed region. The auxiliary groove is preferably provided continuously from the island layer to the element region. That is, it is preferably provided so as to intersect with the exposed region. This allows cleavage to be performed accurately at the intended location.

Furthermore, in the element region, the auxiliary groove may be disposed apart from the exposed region, or as shown in FIGS. 1 and 2, it may be disposed linked to the exposed region. Regardless of whether or not there is a ridge, the auxiliary groove may be disposed in the form of a continuous line, or may be divided up in the form of a broken line, but it is preferably apart from the ridge and formed so as to straddle the ridge. This is to minimize chipping, breakage, etc., of the ridge. In this case, the shortest distance LS from the ridge to the end of the auxiliary groove shown in FIG. 2 is preferably about 1 to 10 µm, and more preferably about 2 to 8 µm.

There are no particular restrictions on the width of the auxiliary groove (N in FIG. 1), but it is about 1 to 5 µm, for example. The depth of the auxiliary groove may be at least the depth to which the first conductivity type nitride semiconductor layer is exposed, and may be about the same depth as that of the exposed region, or about the depth to which the substrate is exposed.

A first auxiliary groove may be formed at the same time as the exposed region in the same etching step and using the same mask, or it may be formed in a separate step.

A ridge is preferably formed on the surface of the laminate, i.e., the second conductivity type nitride semiconductor layer, and functions as an optical waveguide.

The width of the ridge may be from about 1.0 to 50.0 µm and preferably from 1.0 to 3.0 µm for a laser element with a beam shape of a single mode. The height of the ridge (the etching depth) may be, for example, may be from 0.1 to 2 µm by adjusting the thickness, material, and so on of the layer that makes up the p-side semiconductor layer. The ridge is preferably set so as to be 100 to 2000 µm of cavity length. The ridge need not be all the same width in the extension direction of the cavity, and its side faces may be vertical or may be tapered with an angle of about 60 to 90°.

The ridge is preferably formed so as to be disposed perpendicular to the island layer and the auxiliary groove. This allows a better light emission cavity end face to be formed.

The ridge can be formed by forming a mask pattern on a nitride semiconductor layer, and using this mask pattern for etching.

The mask pattern can be formed by using a CVD apparatus, for example, to form an oxide film such as $SiO_2$ or a nitride film such as SiN, and patterning this film into the desired shape by utilizing a known method such as photolithography and etching.

It is good for the thickness of the mask pattern to be such that the mask pattern remaining on the ridge after the ridge has been formed can be removed by lift-off in a subsequent step. An example is about 0.1 to 5.0 µm. Patterning is preferably performed using RIE or another such method, and the use of a halogen-based gas is favorable in this etching. For instance, a chlorine-based gas (such as $Cl_2$, $CCl_4$, $SiCl_4$, and/or $BCl_3$), fluorine-based gas (such as $CF_4$, $CHF_3$, and/or $SiF_4$), or the like can be used favorably.

After this, the mask pattern is utilized to etch the nitride semiconductor layer and form a ridge (see 14 in FIGS. 1 and 2). It is favorable to perform this etching using RIE and a chlorine-based gas, for example. There are no particular restrictions on the substrate temperature during etching, but a lower temperature (e.g., about 60 to 200° C.) is preferred.

Furthermore, the ridge may be formed either before or after the formation of the exposed region and the auxiliary groove.

The laser element of the present invention may also have a structure in which no ridge is formed, and a current constricting layer is formed.

In this case, firstly the first conductivity type nitride semiconductor layer is formed, and a current constricting layer is formed that has a film thickness of about 0.01 to 5 µm, and preferably about 300 nm or less, and has a stripe-like opening with a width of about 0.3 to 20 µm, and preferably about 0.5 to 3.0 µm.

Next, an active layer having a quantum well structure, for example, is formed over the semiconductor layer of the first conductivity type exposed at the opening of this current constricting layer. The second conductivity type nitride semiconductor layer is then formed over the active layer.

This current constricting layer can be formed, for example, from an insulating material such as $SiO_2$ or $Al_2O_3$, or from an i-type nitride semiconductor layer.

The current constricting layer may be formed by forming the semiconductor layer of the first conductivity type or semiconductor layer of the second conductivity type, growing a current constricting layer on the surface thereof, forming a stripe-shaped opening in this current constricting layer, and growing another nitride semiconductor layer.

If desired, a second auxiliary groove is also formed in the island layer. The second auxiliary groove is preferably formed after electrodes have been formed on the second main face of the substrate, but before the primary cleavage is performed. This is because it allows for smoother handling of the wafer in the manufacturing process, and allows laser elements of consistent quality to be manufactured more efficiently.

Figure 9A:
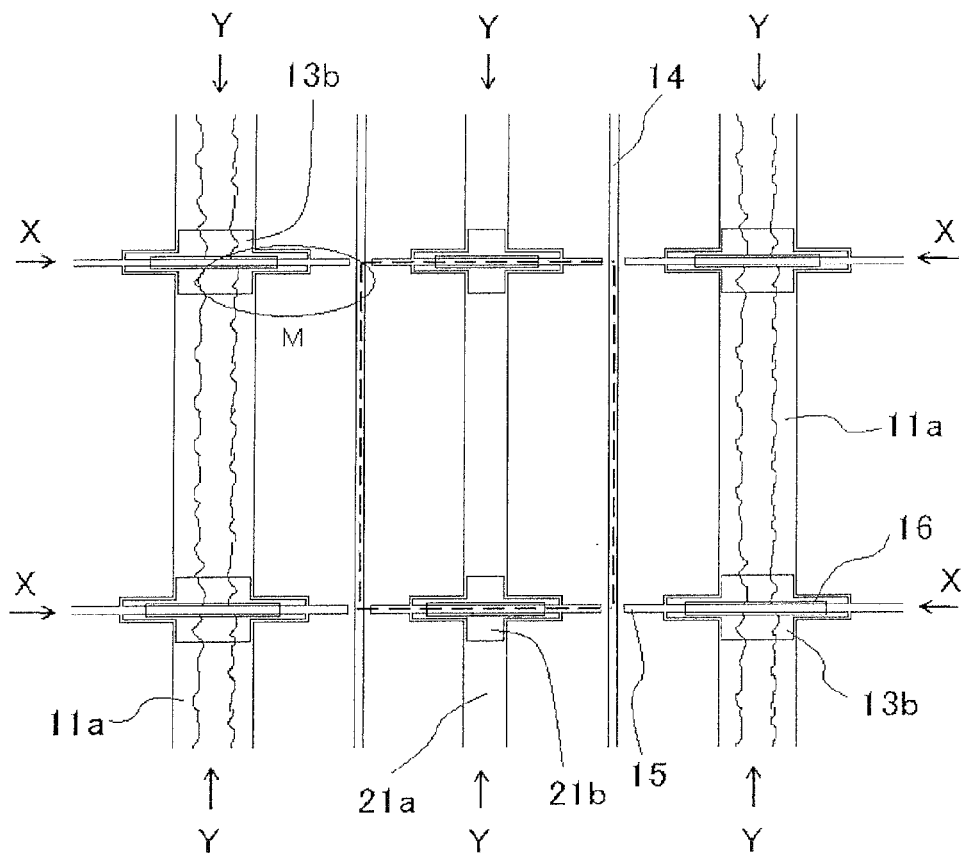
FIG. 9(a) is simplified plan view illustrating another layout of the element region and exposed region formed by the manufacturing method of the present invention, and 9(a') is simplified partial plan view illustrating the unit element.

As shown in FIG. 9a', which is a detail enlargement of the area near M in FIG. 9a, the second auxiliary groove 16 is formed so as to partially overlap the auxiliary groove 15, and deeper than the auxiliary groove 15. In a wafer state, the second auxiliary groove is formed in the island layer. Therefore, in an element state, it is formed adjacent to the island layer.

The second auxiliary groove is preferably formed wider and shorter than the first auxiliary groove. This allows the proper guidance to be performed in the cleavage direction, and cleavage misalignment to be reduced. In particular, when the first auxiliary groove is provided continuously from the island layer to the element region, proper guidance in the cleavage direction can be performed from the island layer all the way to the element region, allowing a cavity end face to be formed more accurately.

When a nitride semiconductor substrate is used that has a region with relatively high dislocation density, crystal defect density, etc., and the second auxiliary groove is formed over this region, the element may be damaged by cleavage in an intended direction, but providing the second auxiliary groove reduces such damage and raises the cleavage yield.

The second auxiliary groove may be formed as a single line on just one island layer, or a plurality may be formed as a broken line.

The second auxiliary groove can be formed by a known method. It may be formed by etching by the same method as the exposed region and the auxiliary groove, or may be formed by another method. When it is formed by etching, it may be formed at the same time in the same etching step, or it may be formed in a separate step. Specific examples of other methods include using a laser scriber (such as a device made by Disco, a device made by Laser Solution, or a device made by Opto System). This groove can be formed from the laminate side, that is, from the side of the second conductivity type nitride semiconductor layer.

In forming the second auxiliary groove, a converged spot of the laser beam being used is adjusted for focal distance, divergence angle occurring during propagation, the size of the incident laser beam, and so forth, and the focal depth is preferably adjusted as dictated by the focal distance, converged spot size, wavelength, and so forth.

As an example, the wavelength of the laser beam that is used may be bout 150 to 600 μm, and the energy level about 0.1 to 10 W. When the second auxiliary groove is provided by laser scribing, depending on the formation condition, pn junctions may be destroyed and leakage may occur. However, the occurrence of leakage can be reduced by forming the second auxiliary groove in the island layer.

For example, the second auxiliary groove is preferably formed to a depth that reaches from the second conductivity type nitride semiconductor layer to the substrate. More specifically, this depth may be about 3 to 30 μm, and especially about 5 to 25 μm.

Selecting the depth and/or shape of the second auxiliary groove as above prevents cracking at unintended stages and locations during the subsequent process, and allows the intended cleavage to be accomplished more easily.

When a plurality of element regions are formed on the substrate (wafer) in the form of a matrix or in a direction perpendicular to the cavity direction or in the cavity direction, the second auxiliary groove they are preferably formed all at once in this step over the entire substrate. When the second auxiliary groove is formed in this way, the groove formation portion for the wafer as a whole can be imaged and recognized in wafer units, so the second auxiliary grooves can be formed in the element regions of the entire wafer in a single operation. This means that the machining process is simplified, and the machining entailed in forming the second auxiliary grooves in the entire wafer will not take as long.

After the second auxiliary groove has been formed, it may be washed as needed. That is, after the second auxiliary groove has been formed, depending on the energy of the laser beam, the metal elements that make up the nitride semiconductor layer may scatter and adhere to the surface of the exposed region around the groove or the surfaces inside the groove, for example.

Therefore, this scattered material is preferably washed away by a known method such as dipping, rinsing, ultrasonic washing, or the like, using, for example, nitric acid, hydrofluoric acid, sulfuric acid, hydrochloric acid, acetic acid, hydrogen peroxide, or another such acid, either alone or as a mixture of two or more of these; ammonia or another such alkali, either alone or as a mixture of ammonia and hydrogen peroxide or the like; any of various surfactants; or another suitable etchant.

This washing effectively removes the scattered material, etc., with the etchant, and therefore avoids the problem of diminished element characteristics that would otherwise be caused by such material. In addition, since the cavity end face has yet to be formed at this stage, the cavity end face is not exposed to the etchant, so the scattered material can be effectively removed without damaging the cavity end face.

At any stage after the ridge stripe has been formed, a first protective film is preferably formed on the surface of the semiconductor layer of the second conductivity type and on both side faces of the ridge. Examples of the material of the first protective film include oxides and nitrides of Ti, Al, Zr, V, Nb, Hf, Ta, Ga, and Si. The first protective film can be formed by a method known in this field, such as CVD, vapor deposition, ECR (electron cyclotron resonance plasma) sputtering, magnetron sputtering, and various other such methods, which can be used to produce a single layer or a laminated structure.

A single-layer film may be formed as a film whose composition is the same but whose film properties differ, by changing the manufacturing method or conditions, or a laminated film of these materials may be used. When a first protective film is formed, it is preferably formed over the nitride semiconductor layer in a state in which the mask pattern used in the formation of the ridge as discussed above is left in place.

Also, the first protective film may be annealed after it has been formed. For example, suitable conditions include annealing at about 300° C. or higher, and preferably about 400° C. or higher, under an atmosphere containing nitrogen and/or oxygen.

A p-side electrode is preferably formed at any stage on the surface of the semiconductor layer of the second conductivity type (when a ridge has been formed, on its surface). When the p-side electrode is one having a two-layer structure composed of nickel and gold, for example, first a nickel film is formed in a thickness of about 5 to 20 nm over p-type semiconductor layer, and then a film of gold is formed in a thickness of about 50 to 300 nm. If the p-side electrode has a three-layer structure, it is formed as Ni—Au—Pt or Ni—Au—Pd, in that order.

A pad electrode may be formed as needed over the p-side electrode. The pad electrode is preferably a laminated film composed of Ni, Ti, Au, Pt, Pd, W, or another such metal. More specifically, an example is a film formed as W—Pd—Au, Ni—Ti—Au, or Ni—Pd—Au, in that order, from the p-side electrode side. There are no particular restrictions on the thickness of the pad electrode, but the thickness of the gold that makes up the last layer is preferably at least about 100 nm. There are no particular restrictions on the shape of the pad electrode, but the shape preferably has projection and/or depression so as to correspond a shape of the island layer and/or the exposed region.

Ohmic annealing is preferably performed at some stage, such as after the p-side electrode has been formed. For example, suitable conditions include annealing at about 300° C. or higher, and preferably about 400° C. or higher, under an atmosphere containing nitrogen and/or oxygen.

A second protective film may also be formed over this first protective film at some stage, such as after the first protective film has been formed. The second protective film can be formed by a method known in this field, and can be selected from among the same materials as the first protective film discussed above.

The second main face of the substrate is preferably polished at some stage, such as before an n-side electrode has been formed. Furthermore, an n-side electrode is preferably formed over all or part of the second main face of the substrate, either before or after the formation of the p-side electrode. An n-side electrode can be formed by sputtering, CVD, vapor deposition, or the like, for example. It is preferable to use a lift-off method to form the n-side electrode, and after the n-side electrode has been formed, it is preferable to perform annealing at about 300° C. or higher.

The n-side electrode can be formed, for example, with the thickness of about 1 μm or less, from the substrate side, of V (thickness: 10 nm)-Pt (thickness: 200 nm)-Au (thickness: 300 nm), Ti(10 nm)-Al(500 nm), Ti(6 nm)-Pt(100 nm)-Au(300 nm), Ti(6 nm)-Mo(50 nm)-Pt(100 nm)-Au(210 nm), Ti(6 nm)-Hf(6 nm)-Pt(100 nm)-Au(300 nm), Ti(6 nm)-Mo(50 nm)-Ti(50 nm)-Pt(100 nm)-Au(210 nm), W—Pt—Au, W—Al—W—Au, etc., or from the nitride semiconductor layer side, of Hf-A, Ti—W—Pt—Au, Ti—Pd—Pt—Au, Pd—Pt—Au, Ti—W—Ti—Pt—Au, Mo—Pt—Au, Mo—Ti—Pt—Au, W—Pt—Au, V—Pt—Au, V—Mo—Pt—Au, V—W—Pt—Au, Cr—Pt—Au, Cr—Mo—Pt—Au, Cr—W—Pt—Au, etc.

The n-side electrode is preferably formed by applying a pattern over an area that excludes a cleavage line, scribe region, and/or the like for forming the cavity end face (discussed below) and/or over a laser scribed groove (discussed below).

The n-side electrode may be formed in the exposed region of the semiconductor layer of the first conductivity type at this stage or any subsequent stage, rather than on the second main face of the substrate. For instance, the n-side electrode may be formed in the exposed region when the substrate is an insulating substrate.

Further, a metallized electrode may be formed over the n-side electrode as needed.

The Examples of the metallized electrode include, for example, Ti—Pt—Au—(Au/Sn), Ti—Pt—Au—(Au/Si), Ti—Pt—Au—(Au/Ge), Ti—Pt—Au—In, Au—Sn, In, Au—S, Au—Ge and the like. There are no particular restrictions on the thickness of the metallized electrode.

After this, or at any stage, the resistance of the p-type semiconductor layer may be lowered by annealing the wafer at a temperature of about 700° C. or higher, in a nitrogen atmosphere, and in a reaction vessel.

When the second auxiliary groove is formed, then after this second auxiliary groove has been formed, the first and second auxiliary grooves are utilized to divide the substrate and the laminate and form a cavity end face. The division here can be accomplished with a known method. For instance, as needed, a circular roller, blade, or the like is brought into contact with the opposite side from the one on which the first and second auxiliary grooves are formed, that is, the substrate side, and stress is concentrated in the first and second auxiliary grooves, allowing the substrate and laminate to be cleaved and divided into bars.

Also, as needed, a dielectric film is preferably formed on the resulting cavity end face, that is, on the light reflection side and/or light emission face of the cavity end face. The dielectric film can be formed of a single or multi layer film by $SiO_2$, $ZrO_2$, $TiO_2$, $Al_2O_3$, $Nb_2O_5$, AlN, AlGaN and the like. When the cavity end face is formed by cleavage, the dielectric film can be formed with good reproducibility.

As needed, the bar-shaped substrate and laminate are divided in the cavity direction in the exposed region. The division here can be accomplished with a known method. For instance, a blade brake, a roller brake, a press brake, or another various other methods can be employed. Furthermore, division can also be performed after subjecting the intended division location to working by laser scribing, RIE or other such etching, or the like, i.e., forming an exposure region or a groove (which is formed at a region corresponding to a broken line B2 as shown in FIG. 8 in the same manner as the auxiliary groove 15 as shown in FIG. 7) at the intended division location. Also, it can be formed the exposed regions or grooves in the form of the wafer (before forming bars). Also, the substrate and laminate can be cleaved and divided by bringing a circular roller, blade, or the like into contact with the substrate side, and concentrating stress in the exposed region. This allows a chip to be obtained that constitutes one unit of a semiconductor laser element.

Also, the nitride semiconductor laser element of the present invention has an exposed region, which comprises a laminate over a substrate, at least the first conductivity type nitride semiconductor layer of is exposed on both sides in the cavity direction of the element region, and the exposed region is provided continuously in the cavity direction of the laser element, and an island layer that is separated from the element region by this exposed region.

As shown in FIGS. 2a and 2a', etc., the island layer is separated from the element region by an auxiliary groove and an exposed region. Providing the above-mentioned auxiliary groove gives an end face of the element region provided to the inside from the cavity end face and continuously with the cavity end face at the end in the cavity direction. The end of the island layer is formed in substantially the same plane as the end face of the element region.

The island layer, as discussed above, is preferably formed at the end of the laser element in the cavity direction. This island layer may be disposed only at the end on the light emission side of the cavity, but may also be disposed at the end on the opposite side. Having the island layer allows an end face protective film to be formed in the desired uniform thickness, and affords better service life characteristics.

If no island layer is provided, and the semiconductor laminate over the region of high dislocation density is removed continuously in the cavity direction, the resulting shape will have a step in the cavity end face, and this may result in uneven electric field strength during sputtering of the end face portion in the formation of the end face protective film, so that the end face protective film is not formed uniformly.

However, providing the island layer makes the step at the cavity end face smaller, so the strength distribution of the electric field during end face protective film formation is more uniform, and the end face protective film can be formed with uniform quality and thickness.

A nitride semiconductor laser element having a uniform end face protective film such as this will undergo less separation of the end face protective film during a service life test, which means that the service life characteristics are enhanced. Also, because the island layer is separated in the cavity direction, there is less of the cracking that would be caused by a difference in the coefficient of thermal expansion attributable to the heat generated during drive of the element. Therefore, this prevents such problems as threshold current increasing, decreased slope efficiency, fluctuation in the current value during drive, and sudden stoppage of oscillation.

Examples of the method for manufacturing a nitride semiconductor laser element and a nitride semiconductor laser element of the present invention will now be described in detail through reference to the drawings.

EXAMPLE 1

A method for manufacturing a laser element of this Example is explained by the following.

First, an n-GaN substrate is set in a reaction vessel of the MOVPE apparatus. In the reaction vessel, a first buffer layer composed of n-$Al_{0.02}Ga_{0.98}N$ doped with Si at $1\times10^{18}/cm^3$ is grown on the GaN substrate using trimethyl aluminum (TMA), trimethyl gallium (TMG) and ammonia ($NH_3$) as the raw material gas with a silane gas for an impurity gas. After that, a second buffer layer composed of n-$In_{0.04}Ga_{0.96}N$ doped with Si at $1\times10^{18}/cm^3$ is grown using trimethylindium (TMI), TMG and $NH_3$ as the raw material gas with a silane gas for an impurity gas.

An n-side clad layer composed of $Al_{0.11}Ga_{0.89}N$ doped with Si at $1\times10^{18}/cm^3$ is grown using TMG, TMA and $NH_3$.

Next, n-side wave guide layer composed of undoped $Al_{0.06}Ga_{0.94}N$ is grown.

The temperature is set to 950° C., a barrier layer composed of $Al_{0.15}Ga_{0.85}N$ doped with Si at $1\times10^{19}/cm^3$ is grown using TMA, TMG and $NH_3$. The silane gas is stopped, a well layer composed of undoped $In_{0.01}Ga_{0.99}N$ are laminated on the barrier layer. At same temperature, finally the barrier layer composed of $Al_{0.15}Ga_{0.85}N$ is formed to grow an active layer composed of a single quantum well structure (SQW).

$Cp_2Mg$ (biscyclopentadienyl magnesium) is used, a p-side cap layer composed of $Al_{0.30}Ga_{0.70}N$ doped with Mg at $1\times10^{20}/cm^3$ is grown on the active layer, and then $Cp_2Mg$ and TMA are stopped, a p-side wave guide layer composed of undoped p-$Al_{0.06}Ga_{0.94}N$ is grown at a growth temperature of 1050° C. This p-side wave guide layer is undoped layer, but magnesium may be included by diffusion from an adjacent layer, such as the p-side cap layer, at $1\times10^{17}/cm^3$.

Next, TMA is used, the temperature is set to 1050° C., and an A layer composed of undoped $Al_{0.13}Ga_{0.87}N$ (2.5 nm thick) is grown, and then $Cp_2Mg$ gas is used, a B layer composed of $Al_{0.09}Ga_{0.91}N$ doped with Mg at $1\times10^{19}/cm^3$ (2.5 nm thick) is laminated. The A layer and the B layer are alternately laminated, and this process is repeated 120 times to grow a p-side clad layer composed of a super lattice structure with a total thickness of 0.6 μm.

Finally, a p-side contact layer composed of GaN doped with Mg at $1\times10^{20}/cm^3$ is grown on the p-side clad layer.

The resulting wafer on which a laminate of the nitride semiconductor layers has been grown is taken out of the reaction vessel, and a mask with a predetermined pattern is formed on the surface of the p-side contact layer. And the nitride semiconductor layers are etched using the mask from the p-side contact layer side to a part of the n-side clad layer to form a exposed layer 11a exposing the n-side clad layer, an island layer 13a and an auxiliary groove 15, as shown in FIG. 1. The length of the cavity was set to about 600 μm, the width of the exposed region 11a to about 30 μm, the shortest distance from the island layer 13a to the ridge 14 to about 75 μm, the shortest distance from the island layer 13a to the laminate of the element region (the width M in FIG. 1) to about 5 μm, and the length of the island layer 13a (the length L in FIG. 1) to about 50 μm. Also, the auxiliary groove 15 was formed at a width N of about 5 μm and a length of about 70 μm in the ridge direction from the end of the exposed region 11a.

Next, a mask pattern composed of $SiO_2$ with a width of about 2.3 μm, stripe-shaped is formed on the surface of the p-side contact layer. After this, RIE and the mask pattern are used to etch down to near the interface between the p-side clad layer and the p-side wave guide layer to form a stripe-like ridge (see 14 in FIG. 1).

In a state in which the mask pattern had been formed, a first protective film composed of laminated layers of $Al_2O_3$ (20 nm thick) and $ZrO_2$ (180 nm thick) was formed on the surface of a nitride semiconductor layer. After this, annealing was performed at 400° C., and then the mask pattern formed over the p-side contact layer was dissolved away, and the first protective film formed over the p-side contact layer was removed along with the mask pattern composed of $SiO_2$ by lift-off method.

Then, a p-side ohmic electrode was formed in a stripe shape on the ridge outermost surface of the p-side contact layer, and a p-side pad electrode electrically connected with the p-side ohmic electrode was formed over this.

The back of the substrate was polished, and an n-side ohmic electrode was formed on the back of a polished n-type GaN substrate.

After this, the GaN substrate was cleaved into wafers along the lines indicated by the arrows X in FIG. 1, for example, to produce cavity end faces along the cleaved planes of the bars.

A dielectric film was formed on the cavity end face. An $Al_2O_3$ film was formed in a thickness of about 70 nm on the light emission side. A multilayer dielectric film comprising a laminated film of $ZrO_2$ and $SiO_2$ (total thickness of about 700 nm) was formed on the opposite side.

After this, the product was divided in a direction perpendicular to the cavity end face (such as along the Y arrows in FIG. 1) to make chips from the bar-shaped wafers.

Figure 2C:
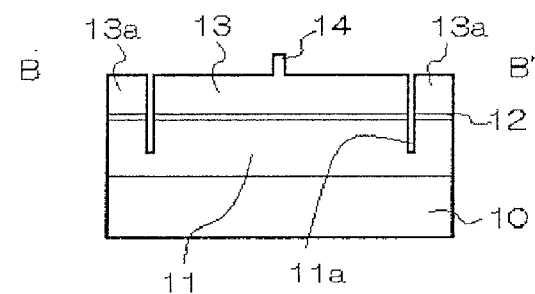

As shown in FIGS. 2a to 2c, the semiconductor laser element thus obtained comprised a substrate 10, over which were laminated an n-type semiconductor layer 11 (e.g., a first conductivity type semiconductor layer), an active layer 12, and a p-type semiconductor layer 13 (e.g., a second conductivity type semiconductor layer) with a ridge 14 formed on its surface. A first protective film (not shown) was formed on both sides of the ridge 14.

Also a p-side electrode (not shown) electrically connected to the ridge 14, and an n-side electrode (not shown) electrically connected to the substrate 10 were formed. Further, an island layer 13a that was separated into islands was disposed in the four corners of the laser element. Since the island layer was divided along the auxiliary groove 15 here, the length L1 of the island layer was about 25 μm. The island layer was divided in the cavity direction in the exposed region, and the width W2 of the island layer was about 150 μm.

Figure 3:
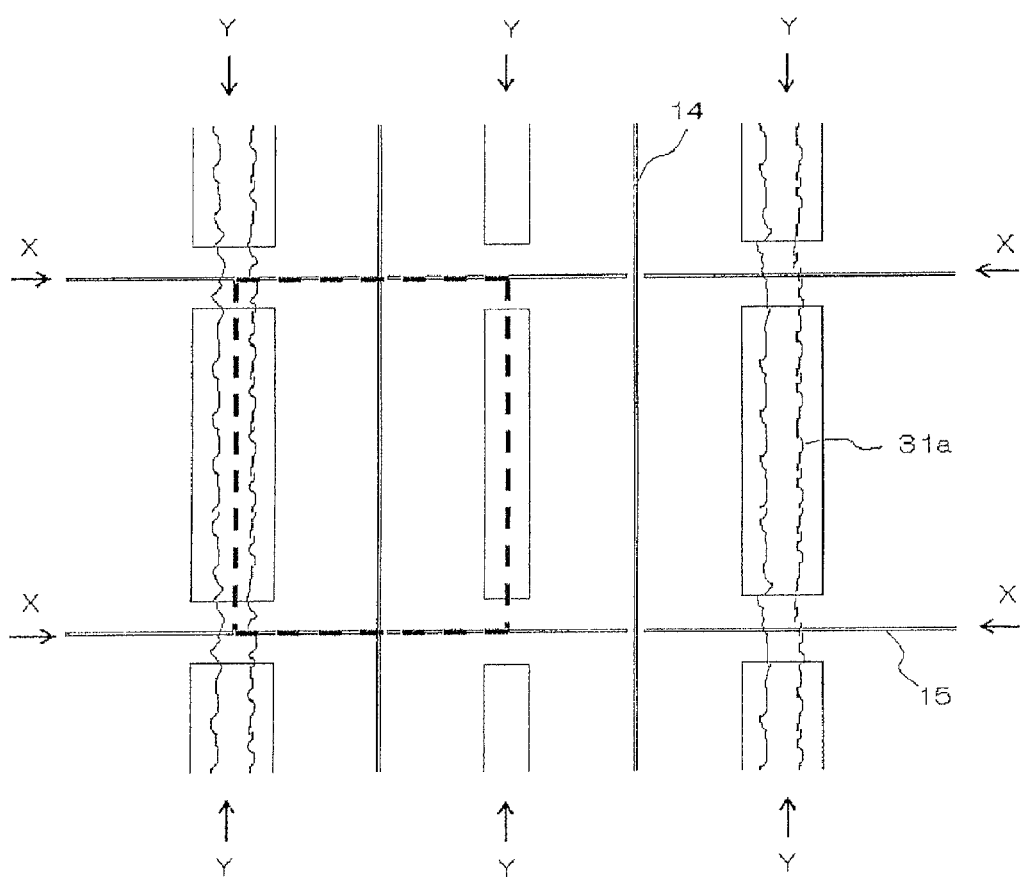
FIG. 3 is simplified plan view illustrating the layout of the element region and exposed region formed by the manufacturing method of the Comparative Example.

As shown in FIG. 3, for the sake of comparison, a semiconductor laser chip was produced by the same method as above, except that the exposed region and island layer were not provided near the cavity end face.

The laser elements thus obtained were measured for current-voltage characteristics using a standard curve tracer.

Figure 4:
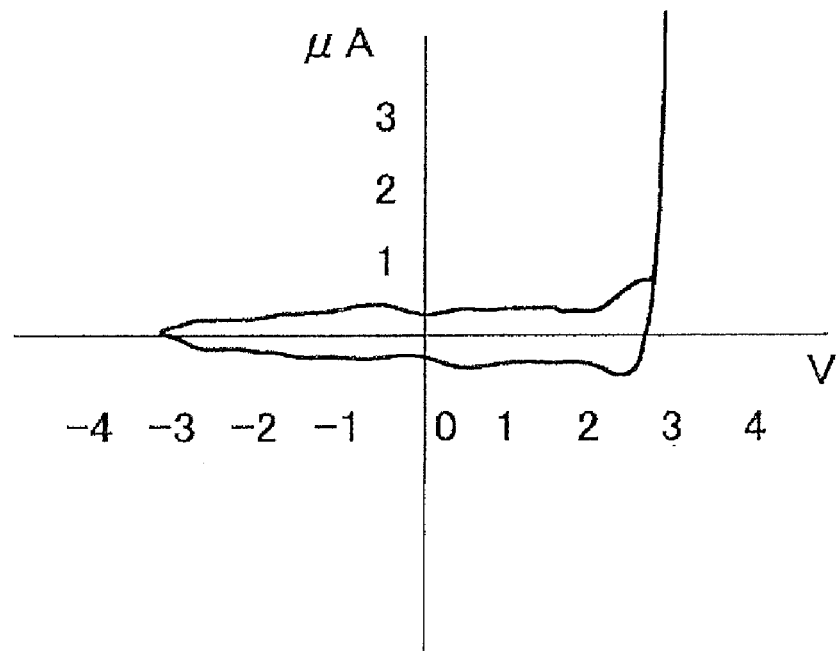
FIG. 4 is a graph illustrating the relation of driving current and voltage of the laser element in the present invention example.
Figure 5:
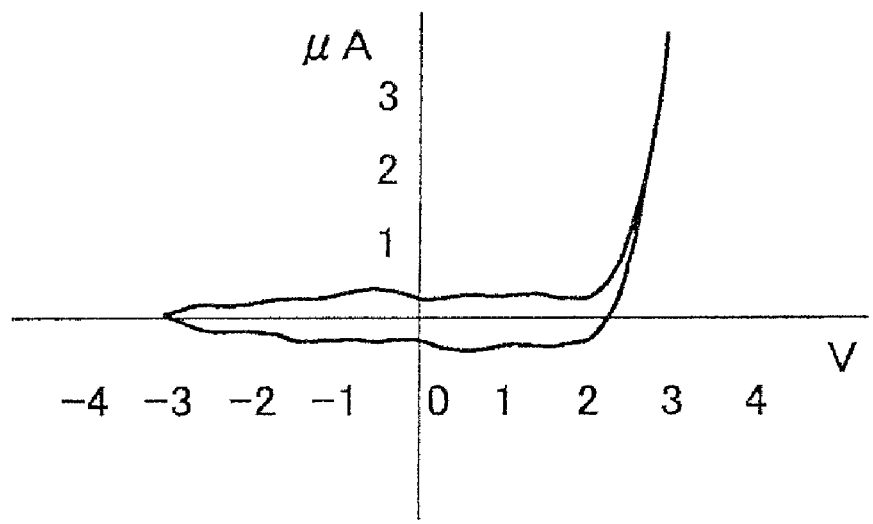
FIG. 5 is a graph illustrating the relation of driving current and voltage of the laser element in the Comparative Example.

As a result, with the laser element of the Example, as shown in FIG. 4, the start-up voltage (Vf–10 μA) of the microcurrent region was high, and the shape of the I-V curve can be seen to be sharper and have better start-up voltage than in the comparative example in FIG. 5. With a laser element having such good start-up voltage, the service life characteristics tended to be better than those of the laser element in the comparative example.

In the division of the wafer using the first and second auxiliary grooves, breakage in the intended direction could be reliably performed. That is, whereas the yield varied widely, from 20 to 80%, in cleavage of the cavity end face in the comparative example, in the Example the yield was higher and more stable at around 70 to 100%.

Also, if laser scribing is utilized, the portions to be laser scribed can be recognized and worked in wafer units, so working time can be shortened and running costs reduced, and since there is no need to replace consumable members as in a scribing method that entails physical contact, manufacturing costs can be lowered further.

Furthermore, since scattered material and so forth can be reliably washed away without damaging the cavity end face, good characteristics can be maintained.

EXAMPLE 2

A semiconductor laser chip is produced by substantially the same method as in Example 1, except that n-type GaN is used, a substrate having a first region of the (0001) plane and a second region of the (000-1) plane, respectively, a low dislocation density region and a high dislocation density region is used, the width of the exposed regions is changed in an alternating pattern, and the widths of the exposed region and the island layer are varied in the cavity end face.

As shown in FIG. 6, the laser element of this Example comprised an exposed region 11a and an exposed region 21a, which respectively have widths of about 70 μm and about 30 μm, and the widths of island layers 13b and 21b near the cavity end face are respectively about 160 μm and about 120 μm.

As shown in FIGS. 7a to 7d, the laser element obtained by this manufacturing method is such that the island layers 13a and 21b are formed with varying widths in the cavity direction. Since the island layers are divided at the auxiliary groove 15 here, the length L1 of the island layers is about 25 μm. Also, the island layers in the exposed region are divided in the cavity direction, and the widths W3+W4 of the island layers are about 80 μm and about 60 μm, respectively.

With this laser element, substantially the same effect as in Example 1 can be obtained for start-up voltage and yield.

EXAMPLE 3

Figure 9A:
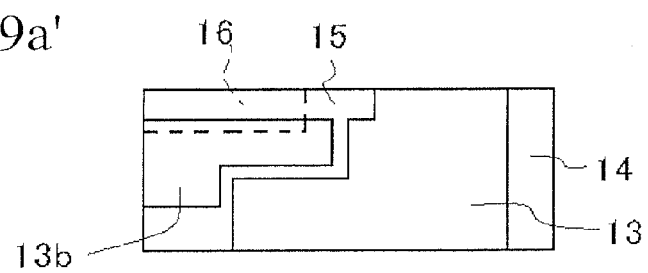

As shown in FIG. 9, a V-shaped laser scribed groove is formed as a second auxiliary groove 16, from the p-type contact layer to the substrate, at a focal distance of just focus±10 μm, a feed rate of 1 to 200 μm/sec, and an output of 0.1 to 10 W, in a direction perpendicular to the cavity direction, after p-side ohmic electrode and an n-side ohmic electrode are formed, but before the cavity end face is produced. The maximum depth of the laser scribed groove in this case is about 25 μm, and the width of the groove on the p-type contact layer surface (the width of the opening of the V-groove) is about 5 μm. The length of the second auxiliary groove 16 in the island layer 13b is 140 μm, and the length of the second auxiliary groove in the island layer 21b is 100 μm.

After this, an acetic acid solution is used to ultrasonically wash the interior and surface of the laser scribed groove, and any scattered material, etc., adhering thereto is removed.

A laser element is then produced in the same manner as in Example 1.

With this laser element, substantially the same effect as in Example 1 is obtained for start-up voltage. Also, compared to Example 1, the yield of primary cleavage is higher, and as a result the overall yield is increased.

EXAMPLE 4

Figure 10:
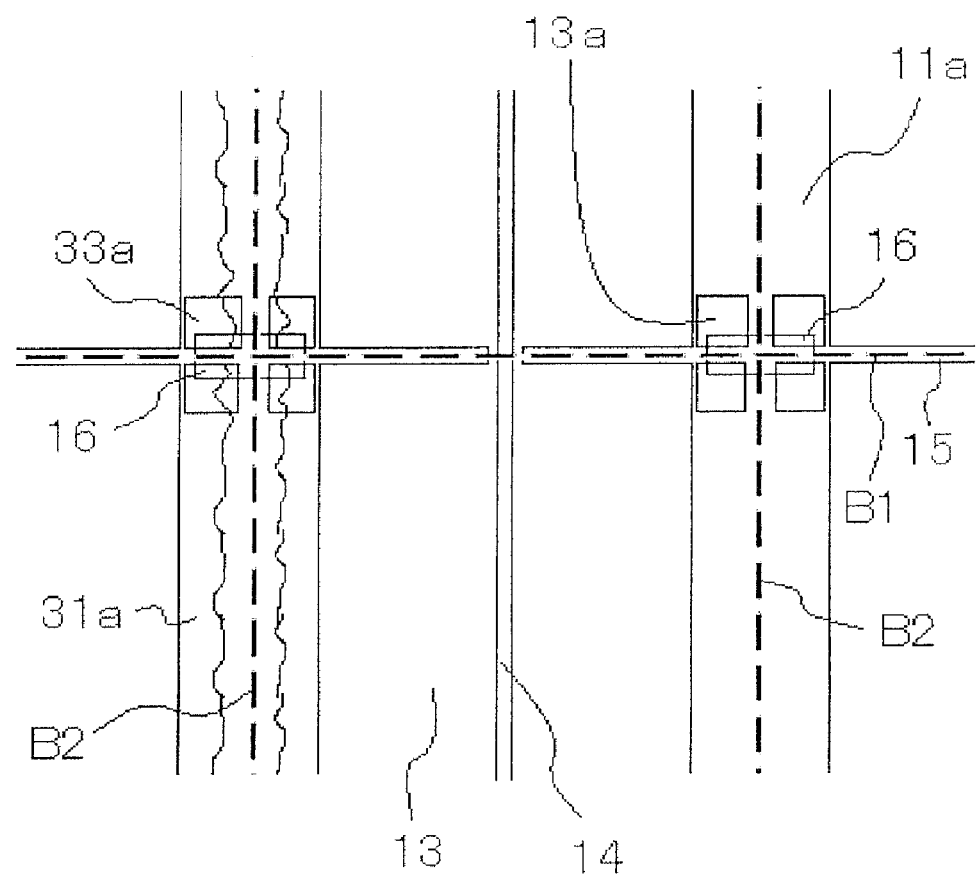
FIG. 10 is simplified plan view illustrating still another layout of the element region and exposed region formed by the manufacturing method of the present invention.

As shown in FIG. 10, with the laser element of this Example, an island layer 13a and an island layer 33a are formed so as to be separated at the intended division location in the cavity direction, and a plurality are disposed in a direction perpendicular to the cavity direction within a single exposed region. Furthermore, the second auxiliary groove 16 is formed within the island layers. The exposed region 11a and the exposed region 31a are formed in respective widths of about 30 μm and about 70 μm, and the island layer 13a is formed at a width of about 12 μm and a length of 7 μm within the exposed region. The island layer 33a is formed at a width of about 32 μm and a length of 7 μm. The second auxiliary groove 16 is formed as shown in FIG. 10, in the same manner as in Example 3, after the p-side ohmic electrode and an n-side ohmic electrode are formed, but before the cavity end face is produced.

After this, a laser element is produced in the same manner as in Example 1, and divided in the region indicated by the broken lines B1 in the auxiliary groove 15 and B2.

As shown in FIGS. 2a to 2c, the laser element obtained by this manufacturing method is such that the island layers 13a and 33a, which are separated into islands, are disposed in the four corners of the laser element. With this laser element, substantially the same effect as in Example 1 is obtained for start-up voltage. Also, compared to Example 1, the yield of primary cleavage is higher, and the yield of secondary cleavage is increased. As a result the overall yield is higher.

EXAMPLE 5

As shown in FIG. 11a, with the laser element of this Example, an island layer 43a and an island layer 43b are formed so as to be separated to each other at the intended division location in the cavity direction, and a plurality are disposed in a direction perpendicular to the cavity direction within a single exposed region. Furthermore, an exposed region 41a is formed wider so as to protrude to just one side, and the island layer 43a is formed so as to correspond to the shape of this exposed region 41a.

As shown in FIG. 11b, the island layer 43a is formed wider near the cavity end face. The width of the exposed region 41a is about 30 μm, and within the exposed region, the island layer 43a is formed wider, with a width of about 62 μm, while the island layer 43b is formed at a width of about 12 μm. The length of the island layers 43a and 43b is 7 μm.

After this, a laser element is produced in the same manner as in Example 1, and divided in the region indicated by the broken lines B1 in the auxiliary groove 15 and B2.

As shown in FIG. 11b, with the laser element obtained by this manufacturing method, the island layers 43a and 43b, which have different widths on the left and right, are disposed near the cavity end face. Also, with the laser element of this Example, the cavity length is 300 μm and the width of the element is 120 μm.

With this laser element, substantially the same effect as in Example 1 is obtained for start-up voltage and yield. Also, this laser element is more compact than in the other Examples, but because a wide region is provided on one side of the element, the region of wire bonding can be made wider.

EXAMPLE 6

Figure 12A:
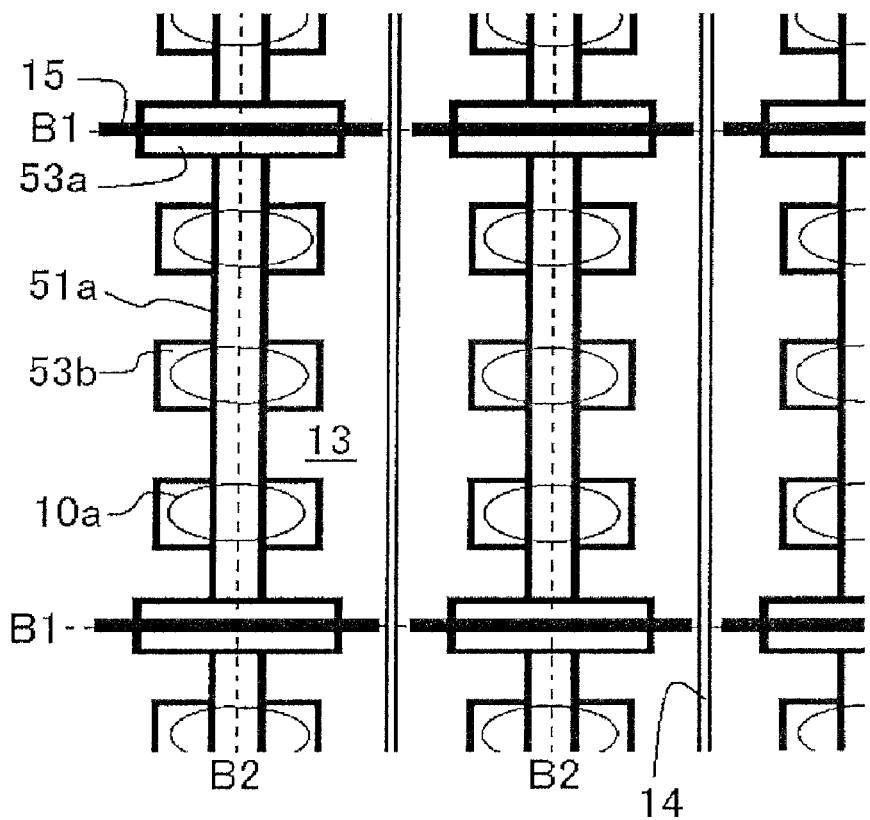
FIG. 12(a) is simplified plan view illustrating still another layout of the element region and exposed region formed by the manufacturing method of the present invention, and 12(b) is simplified plan view illustrating the unit element.

A semiconductor laser is produced by using an n-type GaN substrate which has a first region of the (0001) plane and a second region of the (000-1) plane, respectively, a low dislocation density region and a high dislocation density region as shown in FIG. 12a. The high dislocation density region is formed with a ellipse-shape having a major axis diameter of 80 μm and a miner axis diameter of 79 μm over a wafer at regular intervals.

A second island layer 53b is formed in addition to island layers 53a disposed in the four corners of the laser element. In particular, the width of the element regions is periodically changed, and the exposed region 51a and the second island layers 53b are formed corresponding to this change. The laser element is formed by dividing the wafer along a broken line B1 which is along a auxiliary groove 15 formed parallel to the cavity end face and a broken line B2 so as to dispose the island layer 53*a* in the four corners of the laser element.

The laser element of this Example is produced by substantially the same method as in Example 1 except above.

Figure 12B:
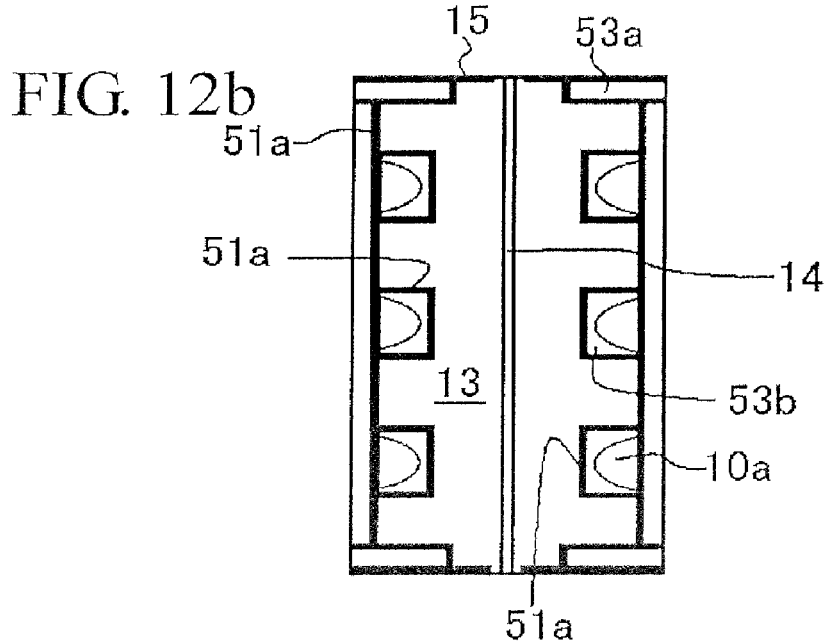

As shown in FIG. 12*b*, with the laser element of this Example, the cavity length is 1200 μm, and the width of a chip is 200 μm. The island layers 53*a*, which respectively have the widths of 71 μm and the lengths of 24 μm, are disposed in the four corners of the laser element. The exposed layer 51*a*, which has the width of 2 μm, is formed around the island layers 53*a*, and expands from around the island layer 53*a* continuously in the direction of the cavity parallel with the ridge 14. The element region is changed periodically its width, and three second island layers 53*b* are formed corresponding to this change. The second island layer 53*b* has the width of 52 μm and the length of 144 μm, and disposed a distance of 20 μm from the end face of the laser element.

With this laser element, substantially the same effect as in Example 1 can be obtained for start-up voltage and yield.

The present invention is available in the method for manufacturing a light emitting diode (LED) as well as the laser element.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A nitride semiconductor laser element comprising:
   a laminate that includes on a substrate a first conductivity type nitride semiconductor layer, an active layer, and a second conductivity type nitride semiconductor layer, and that constitutes a cavity resonator,
   the laminate including
      an element region in which the laser element is formed,
      an exposed region in which at least the first conductivity type nitride semiconductor layer is exposed on both sides of the element region in the cavity direction, and which is provided continuously in a cavity resonating direction of the laser element, and
      an island layer that is separated from the element region by the exposed region with the exposed region being disposed between the island layer and the element region, and that is disposed in a corner of the nitride semiconductor laser element.

2. The element according to claim 1, wherein
the element region has a cavity end face, and an end face provided to the inside of the cavity end face and continuously with the cavity end face, and
the island layer has an end face provided in substantially the same plane as the end face of the element region.

3. The element according to claim 1, wherein
the island layer is wider at an end face of the cavity resonator.

4. The element according to claim 1, wherein
the substrate has a first region that alternates with a second region that has a higher dislocation density than the first region, and the exposed region is disposed above the second region.

5. The element according to claim 1, wherein
the island layers are provided at both corners of an end face of the cavity resonator on at least the light emission side, and a stripe-like ridge extending in the cavity resonating direction and being at substantially the same distance from the island layer is formed on the surface of the second conductivity type nitride semiconductor layer.

6. The element according to claim 1, wherein
the island layers are provided at both corners of an end face of the cavity resonator on at least the light emission side.

* * * * *